United States Patent [19]

Nagata et al.

[11] 3,846,821

[45] Nov. 5, 1974

[54] LATERAL TRANSISTOR HAVING EMITTER REGION WITH PORTIONS OF DIFFERENT IMPURITY CONCENTRATION

[75] Inventors: Minoru Nagata; Kozi Sato, both of Kodaira, Japan

[73] Assignee: Hitachi, Ltd., Tokyo, Japan

[22] Filed: Feb. 9, 1971

[21] Appl. No.: 114,021

Related U.S. Application Data

[62] Division of Ser. No. 772,913, Nov. 4, 1968, Pat. No. 3,652,347.

[30] Foreign Application Priority Data

Nov. 6, 1971 Japan .............................. 46-70971

[52] U.S. Cl. .................................... 357/35, 357/35

[51] Int. Cl. .......................................... H01l 29/72

[58] Field of Search ................317/235, 148.1, 40.12

[56] References Cited

UNITED STATES PATENTS

| | | | |
|---|---|---|---|
| 3,427,513 | 2/1969 | Hilbiber | 317/235 |
| 3,434,021 | 3/1969 | Hofstein | 317/235 |
| 3,500,140 | 3/1970 | Makimoto et al. | 317/235 |
| 3,534,231 | 10/1970 | Biard | 317/235 |
| 3,551,760 | 12/1970 | Tokuyama et al. | 317/235 |
| 3,596,149 | 1/1970 | Makimoto | 317/235 |

*Primary Examiner*—Rudolph V. Rolinec
*Assistant Examiner*—E. Wojciechowicz
*Attorney, Agent, or Firm*—Craig & Antonelli

[57] ABSTRACT

A lateral transistor has, selectively diffused therein, a P-type emitter region on one principal surface of an N-type silicon substrate. Acceptor impurities are introduced into the emitter region and in one portion of the surface of the substrate at a prescribed distance from the emitter region, so that the emitter region and a P-type collector region are disposed to have prescribed surface impurity concentrations. The distance between the emitter region and the collector region through the base-surface of the substrate is less than the diffusion length of minority carriers within a substrate.

10 Claims, 7 Drawing Figures

LATERAL TRANSISTOR HAVING EMITTER REGION WITH PORTIONS OF DIFFERENT IMPURITY CONCENTRATION

This is a divisional application of application Ser. No. 772,913, filed Nov. 4, 1968, now U.S. Pat. No. 3,652,347.

This invention relates to an improved method for manufacturing a semiconductor device, particularly a lateral transistor.

A semiconductor device such as a diffusion type transistor, a semiconductor integrated circuit, etc., in which the diffusion technique is applied to a silicon substrate is an important element in the semiconductor field. Usually PN junctions are formed by repeating the diffusion step in the same portion of the substrate. Recently another type of PN junction element not formed by the repetition of diffusion has been developed, i.e., a lateral transistor, which is mainly used in a semiconductor integrated circuit.

The present monolithic silicon integrated circuit consists mainly of an NPN transistor alone which is obtained by repeating diffusion along the depth of a semiconductor substrate. No practical PNP transistor has yet been obtained. One method for obtaining NPN and PNP transistors simultaneously is to introduce an acceptor impurity, e.g., phosphorus into two portions of a substrate while the base region of the NPN transistor is diffused. Thus the base and collector regions of the PNP transistor, which utilizes a lateral current flow, is obtained. According to this method in which the emitter and the collector are simultaneously formed by the same diffusion treatment, the base width is determined by the dimension of a mask. The emitter and collector regions formed simultaneously have the same impurity concentration. Therefore, any improvement cannot be observed in the current gain $h_{FE}$ and the collector reverse breakdown voltage. Generally the current gain is expressed by the product of the emitter efficiency, the transport factor, and the collector efficiency. For a constant base impurity concentration the emitter efficiency rises as the emitter impurity concentration increases. However, the collector impurity concentration can not be made large in view of the breakdown voltage. The transport factor is related to the base width and the hole diffusion length in the base region. The base width is desirably small while the hole diffusion length is large. When the base and emitter regions of a transistor are formed by repeated diffusion, as in the case of a planar transistor, the base width can be controlled so as to be extremely thin by the diffusion temperature and time with relatively high accuracy. However, when the base region is formed between the emitter and collector regions which are formed in advance by simultaneous diffusion, it is hard for the base region to be controlled thin because it is determined by the accuracy of a diffusion pattern.

Therefore, one object of this invention is to provide an improved diffusion method capable of obtaining a semiconductor device having good electrical characteristics.

Another object of this invention is to provide an improved method for obtaining a lateral transistor in which the current gain, the collector reverse breakdown voltage, etc. are improved.

Still another object of this invention is to provide a method for manufacturing a lateral transistor in which the base width is accurately controlled.

A further object of this invention is to provide a simple method for manufacturing an integrated circuit containing NPN transistors and high efficiency PNP transistors.

As will be evident from the following explanation, the gist of this invention is a method for manufacturing a semiconductor device comprising forming a first region of a second conductivity type in one principal surface of a semiconductor substrate of one conductivity type and forming by a selective diffusion method second and third regions of the second conductivity type in said principal surface of said substrate simultaneously and separately from each other so that a portion of said second region is overlaid at least on one portion of said first region. Therefore, if this invention is applied to the manufacture of a transistor, an impurity concentration in the main portion of an emitter region can be made sufficiently large and hence the current gain can be increased. Further, the collector impurity concentration is decreased so that the breakdown voltage is maintained at a satisfactory value. The peripheral portion of the emitter region operates effectively to further increase the current gain. Since the emitter junction is formed simultaneously with the collector and the high impurity concentration region does not extend from the emitter region, the base width is accurately defined. Considering these facts the inventive diffusion method can overcome the defects observed in the prior art method, and provides a semiconductor device having excellent characteristics.

Above and other objects and features of this invention will be made more apparent from the following explanation taken in conjunction with the accompanying drawings, in which;

FIG. 1 is a front perspective sectional view of a lateral transistor.

FIGS. 2*a*, 2*b* and 2*c* are the main sectional view of a semiconductor wafer in each manufacturing step according to one embodiment of this invention.

The invention will be explained with reference to the drawings.

Figure 1:
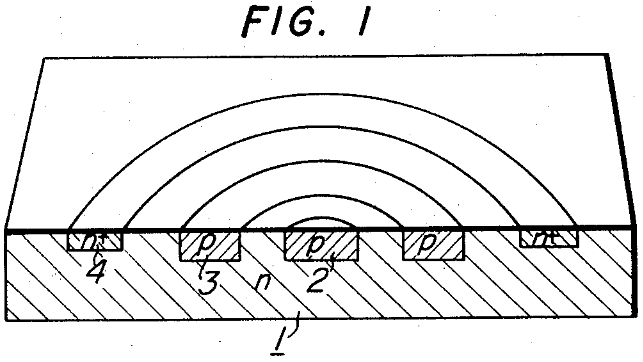

For the sake of better understanding of this invention FIG. 1 shows an example of lateral transistors. 1 is a base region of N type silicon substrate, 2 is an emitter region formed in one portion of the substrate and doped with P type impurity, 3 is a collector region doped with P type impurity and formed in such a sense as to surround the emitter region at a constant distance therefrom, and 4 is a base electrode led-out portion of $N^+$ type diffusion layer formed to surround the collector region at a constant distance therefrom.

This structure is obtained by introducing an acceptor in the surface of substrate 1 to form the emitter region 2 and the collector region 3 simultaneously.

Next concrete embodiments of this invention will be explained.

Figure 2A:
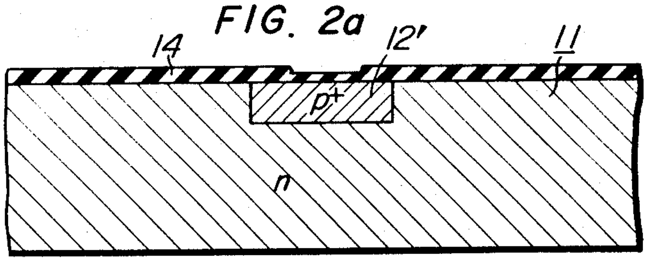
Figure 2B:
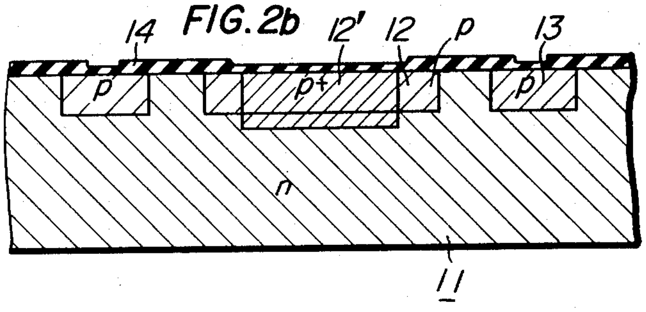
Figure 2C:
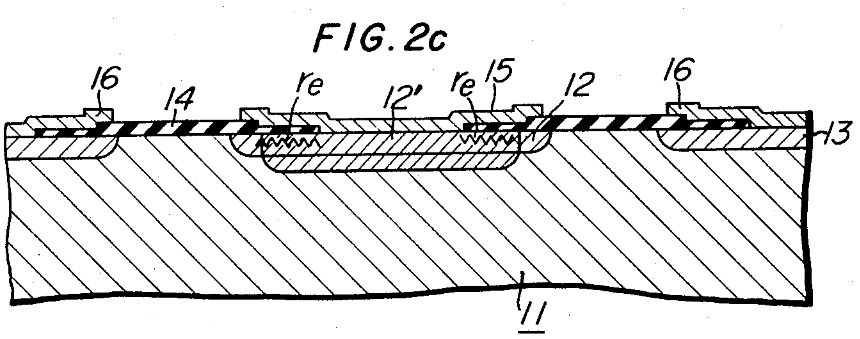

FIGS. 2a, 2b and 2c show the manufacturing steps of a PNP lateral transistor according to one embodiment of this invention. A silicon wafer or substrate is cut out from an N type silicon monocrystalline bar to obtain a surface parallel to the (111) or (100) crystal plane. As shown in FIG. 2a, an insulating film 14 such as a silicon oxide film with a thickness of about a few thousands A is formed on the surface of substrate 11. A first window is perforated in the insulating film 14 for the next diffusion treatment. A relatively high concentration of acceptor impurity such as boron is diffused in one portion of the surface of a substrate through the first window, thereby to form a $P^+$ type region 12′ with a thickness of about 3$\mu$ and a surface impurity concentration of about $10^{19}$ atoms/cc. The first window is covered with a new oxide film.

A second window having a diameter of 1 to 3 $\mu$, larger than that of the $P^+$ region 12′, is perforated around the first window in the film 14, and a third ring type window is further perforated at a distance of about 10$\mu$ from the second window so as to surround the second window. The whole P type region 12′ is exposed by the second window. The end portion of PN junction around the region 12′ is also exposed. An acceptor impurity such as boron is diffused in the substrate through the second and third windows as shown in FIG. 2b, thereby forming a P type diffused region 12 (emitter region) and a ring type collector region 13 which have a surface impurity concentration of about $10^{18}$ atoms/cc and a depth of 2 to 3 $\mu$. The second and third windows are next covered with newly grown silicon oxide. The base width is determined substantially by the gap between the second and third windows and by the diffusion depth of the regions 12 and 13. In the above embodiment the base width of the transistor is about 4 to 6 $\mu$. It is desirable, in order to ensure a sufficient current gain, that the distance between the P-type region 12 and the collector region 13, i.e., the base width, is less than the diffusion length of minority carriers (holes) in the substrate (base region).

In the above manufacturing method the position of the second and third windows should be defined so that the $P^+$ type region 12′ does not reach the collector region 13 over the emitter region 12. By doing so the base width is easily controlled by the distance between the second and third diffusion windows. The emitter efficiency and the current gain are effectively increased by increasing the emitter impurity concentration. It is desirable in order to increase the emitter efficiency that the distance between the $P^+$ type region 12′ and the emitter region 12 is less than the diffusion length of the minority carrier (electron) in the emitter, i.e., 1 to 10 $\mu$.

FIG. 2c shows the main sectional view of a PNP lateral transistor in which electrodes 15 and 16 are formed on the emitter and the collector respectively. The characteristic of this transistor is that the emitter efficiency and current gain are increased because the emitter contains a high impurity concentration region.

As seen in FIG. 2c, due to the structure according to this invention the resistance $r_e$ between the emitter electrode 15 and the PN junction formed between the base region 11 and the peripheral portion of emitter 12 is reduced. Namely, the emitter resistance component is descreased substantially uniformly over the whole portion in the emitter region 12. This has the advantage that the minority carrier injected from the emitter is prevented from concentrating in the central bottom portion of the emitter region 12.

Figure 5:
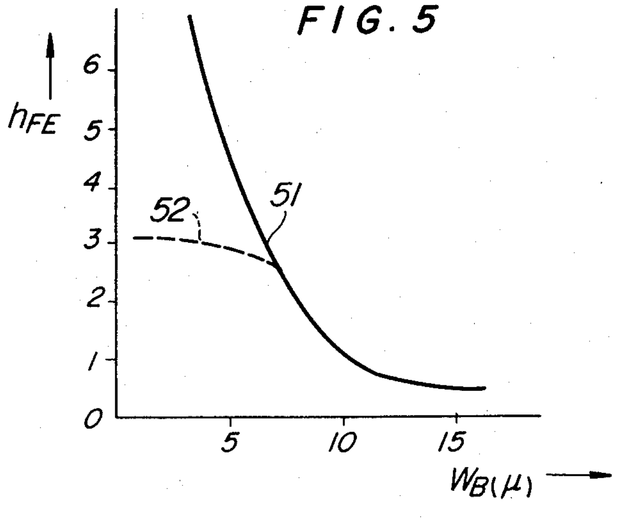
FIG. 5 shows curves for comparing the effect of the inventive transistor with that of a prior art one.

This invention has another advantage that even if the base width is decreased the current gain $h_{FE}$ does not become saturated (See the curve 51 shown in FIG. 5). As shown in FIG. 5, the current gain is nearly in inversely proportion to the base width. While the current gain of a conventional transistor becomes saturated as indicated by the broken line 52 in FIG. 5 when the base width is less than about 7 $\mu$, this is not the case in the transistor of this invention.

It is particularly to be noted that the current gain $h_{FE}$ depends on the crystal surface. The current gain $h_{FE}$ of a lateral transistor formed in the exposed (111) crystal surface of a wafer is 1 to 1.5 in the conventional method, whereas it is increased to 2 to 3 in the present method. It is found that when the lateral transistor is formed in the semiconductor substrate having the surface parallel to the (100) crystal plane the present method can increase $h_{FE}$ as much as 5 to 10.

Figure 4:
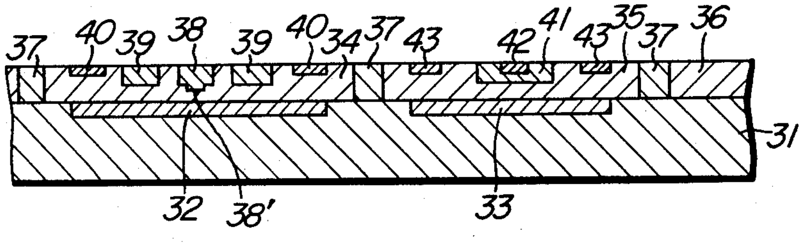
FIG. 4 is a partial sectional view of a semiconductor integrated circuit means according to a further embodiment of this invention.

Usually the above transistor is combined with an NPN transistor to be integrated in a semiconductor substrate as shown in FIG. 4, in which on the surface of a P type semiconductor substrate, $N^+$ type buried layers 32 and 33 and an N type epitaxial grown semiconductor layer are formed. The semiconductor layer is divided into isolated portions 34, 35 and 36 by the P type isolation layer 37.

One example of the manufacturing method of the integrated circuit means as shown in FIG. 1 will be explained hereinafter. The formation of the isolation layer 37 is done as follows. A $P^+$ type highly doped region is preliminarily formed in a usual substrate. An acceptor impurity is diffused from the surface of the epitaxial layer to meet there the highly doped $P^+$ type region. Simultaneously with isolation diffusion an acceptor impurity is introduced in a prescribed portion of the N type region 34 to form the highly doped emitter region 38′ (the region corresponds to the portion 12′ in FIG. 2a). Thereafter the P type base region 41 of the NPN transistor, and the emitter region 38 and the collector region 39 of the PNP transistor are formed by simultaneous diffusion. The emitter region 42 and the collector contact portion 43 of the NPN transistor and the base contact portion 40 of the PNP transistor are formed by diffusing a high concentration of donor impurity.

As described above the application of this invention to an integrated circuit means is easily done without any additional step. It is evident therefore that the advantage of this invention is available in the field of semiconductor integrated circuits.

Figure 3:
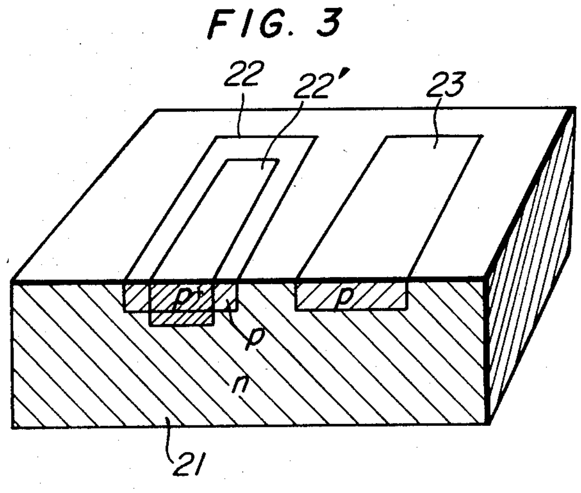
FIG. 3 is a front perspective sectional view of a finished lateral transistor according to the method in another embodiment of this invention.

FIG. 3 shows another embodiment where this invention is applied to a stripe type diffusion transistor. In this FIG., 21 is a base of an NPN type silicon substrate, 22′ a $P^+$ type diffused region, 22 and 23 are the P type diffused emitter and collector respectively. The $P^+$ type diffused region 22′ should not extend further than the emitter 22. But here it is sufficient to take care that the region 22′ does not extend towards the region 23.

Although explanation has been given only of a few embodiments of this invention, this invention is not restricted by such examples. Various modifications may be made by those skilled in the art without departing from the appended claims.

What is claimed is:

1. A lateral transistor comprising:
a semiconductor substrate of a first conductivity type;
a first diffused region of a second conductivity type with a relatively high impurity concentration formed in one principal surface of said substrate;
a second diffused region of the second conductivity type with a relatively low impurity concentration formed at least in one portion of said first diffused region and in one portion of said substrate adjacent thereto;
a third diffused region with an impurity concentration distribution the same as that of said second diffused region formed in said principal surface of said substrate near the second diffused region, the distance between said second and third diffused regions being defined shorter than the diffusion length of a minority carrier in said substrate; and
an emitter, a collector and a base electrode connected to the first region, the third region and the substrate, respectively.

2. A lateral transistor according to claim 1, wherein the depth of said second diffused region is defined less than that of said first diffused region.

3. A lateral transistor according to claim 1, wherein said third diffused region is formed so as to surround said first and second diffused regions.

4. A lateral transistor according to claim 2, wherein said third diffused region is formed so as to surround said first and second diffused regions.

5. A lateral transistor comprising:
a semiconductor substrate of a first conductivity type;
an epitaxially grown semiconductor layer of a second conductivity type formed on said substrate;
a pair of first and second diffused regions of the first conductivity type with a predetermined impurity concentration distribution formed in one principal surface of said semiconductor layer;
a third semiconductor region of the first conductivity type formed in said semiconductor layer so as to reach said substrate and to surround said diffused regions;
a buried semiconductor layer of the second conductivity type with an impurity concentration higher than that of said semiconductor layer formed on said substrate surface at the portion under said first and second diffused regions, the distance between said first and second diffused regions being defined shorter than the diffusion length of a minority carrier in said semiconductor layer; and
an emitter, a collector and a base electrode connected to said first region, said second region and said semiconductor layer, respectively.

6. A lateral transistor according to claim 5, further comprising a fourth semiconductor region of the first conductivity type with an impurity concentration higher than that of the first diffused region formed in the principal surface of said semiconductor layer so as to contact said first diffused region.

7. A lateral transistor according to claim 1, wherein said substrate is N-type silicon and said second conductivity is P-type.

8. A lateral transistor according to claim 5, wherein said substrate is P-type silicon and said second conductivity type is N-type.

9. A lateral transistor comprising:
a semiconductor base substrate of a first conductivity type;
an emitter region formed of a first diffused region of a second conductivity type having a relatively low impurity concentration formed in one principal surface of said substrate, and
a second diffused region of said second conductivity type, having a relatively high impurity concentration compared to that of said first region, extending from said principal surface of said substrate through a selected portion of said first region to a depth in said substrate greater than the depth of said first region, so that said first and second diffused region partially overlap each other in a portion of said substrate extending from said principal surface thereof;
a third diffused collector region, of said second conductivity type and the same impurity concentration distribution as that of said first region, formed in said principal surface of said substrate at a portion thereof adjacent said first region and being laterally separated from said first region by the surface portion of the base substrate therebetween, the distance of said lateral separation being less than the diffusion length of a minority carrier in said substrate; and
emitter, base, and collector electrodes respectively connected to said second region, said substrate, and said third region.

10. A lateral transistor according to claim 9, wherein the surface of said crystal lies in a plane parallel to the (100) crystal plane.

* * * * *